United States Patent
Lian et al.

(10) Patent No.: US 7,652,774 B2
(45) Date of Patent: Jan. 26, 2010

(54) INTERFEROMETRIC ENDPOINT DETERMINATION IN A SUBSTRATE ETCHING PROCESS

(75) Inventors: Lei Lian, Santa Clara, CA (US); Matthew F Davis, Brookdale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 24 days.

(21) Appl. No.: 11/953,853

(22) Filed: Dec. 10, 2007

(65) Prior Publication Data
US 2008/0151237 A1  Jun. 26, 2008

Related U.S. Application Data

(62) Division of application No. 10/286,402, filed on Nov. 1, 2002, now Pat. No. 7,306,696.

(51) Int. Cl.
*G01B 11/02* (2006.01)
*H01L 21/3065* (2006.01)
*C23C 16/00* (2006.01)
*C23C 14/00* (2006.01)

(52) U.S. Cl. ...................................... 356/503

(58) Field of Classification Search ................ 356/498, 356/503–504; 438/14, 16
See application file for complete search history.

(56) References Cited

U.S. PATENT DOCUMENTS

| | | | |
|---|---|---|---|
| 4,454,001 A | 6/1984 | Sternheim | |
| 5,337,144 A | 8/1994 | Strul | |
| 5,405,488 A | 4/1995 | Dimitrios et al. | |
| 5,450,205 A | 9/1995 | Sawin | |
| 5,658,418 A | 8/1997 | Coronel et al. | |
| 5,885,472 A | 3/1999 | Miyazaki et al. | |
| 6,052,188 A | 4/2000 | Fluckiger | |
| 6,081,334 A * | 6/2000 | Grimbergen et al. | 356/499 |
| 6,090,302 A | 7/2000 | Smith | |
| 6,113,733 A | 9/2000 | Eriguchi et al. | |
| 6,160,621 A | 12/2000 | Perry | |
| 6,406,641 B1 | 6/2002 | Golzarian | |
| 6,406,924 B1 * | 6/2002 | Grimbergen et al. | 438/9 |
| 6,521,080 B2 | 2/2003 | Balasubramhanya | |
| 6,855,567 B1 * | 2/2005 | Ni et al. | 438/8 |

(Continued)

FOREIGN PATENT DOCUMENTS

JP  2000 292129 A  2/2001

(Continued)

OTHER PUBLICATIONS

Bosch-Charpenay, S. et al.: "Real-Time Etch-Depth Measurements of MEMS Devices" Journal of Microelectromechanical Systems, IEEE Inc. New York, vol. 11, No. 2, Apr. '02, pp. 111-117.

(Continued)

*Primary Examiner*—Michael A Lyons
(74) *Attorney, Agent, or Firm*—Janah & Associates, P.C.

(57) ABSTRACT

In determining an endpoint of etching a substrate, light that is directed toward the substrate is reflected from the substrate. A wavelength of the light is selected to locally maximize the intensity of the reflected light at an initial time point of the etching process. The reflected light is detected to determine an endpoint of the substrate etching process.

18 Claims, 7 Drawing Sheets

U.S. PATENT DOCUMENTS

| | | | |
|---|---|---|---|
| 7,306,696 B2 * | 12/2007 | Lian et al. | 156/345.25 |
| 2002/0001862 A1 | 1/2002 | Ushio | |
| 2003/0043383 A1 | 3/2003 | Usui et al. | |

FOREIGN PATENT DOCUMENTS

| | | |
|---|---|---|
| WO | WO-0124235 A2 | 4/2001 |
| WO | WO-0235586 A2 | 5/2002 |

OTHER PUBLICATIONS

"In Situ Etch Rate Detecting Technique" IBM Technical Disclosure Bulletin, IBM Corp. New York, vol. 28, No. 9, Feb 1986 (Feb. 1986) pp. 3952-3954.

Haverflag, M. et al.: "In Situ Ellipsometry and Reflectometry During Etching of Patterned Surfaces": Journal of Vac. Sci and Tech.: PT.B; New York, vol. 10, No. 6, Jan. 11, 1992.

European Search Report of EP Patent Application No. EP 03 02 5110, dated Feb. 24, 2004. European Patent Office, P.B. 5818-Patentlaan 2, 2280 HV Rijswijk (ZH).

Hassanzadeh, P (Examiner, USPTO), U.S. Appl. No. 10/286,402 entitled "Interferometric Endpoint Determination in a Substrate Etching Process", Office Action dated Nov. 12, 2004.

Kackar, R (Examiner, USPTO), U.S. Appl. No. 10/286,402 entitled "Interferometric Endpoint Determination in a Substrate Etching Process", Final Office Action dated May 20, 2005.

Kackar, R (Examiner, USPTO), U.S. Appl. No. 10/286,402 entitled "Interferometric Endpoint Determination in a Substrate Etching Process", Advisory Action dated Nov. 17, 2005.

Kackar, R (Examiner, USPTO), U.S. Appl. No. 10/286,402 entitled "Interferometric Endpoint Determination in a Substrate Etching Process", Office Action dated Jul. 12, 2006.

* cited by examiner

INTERFEROMETRIC ENDPOINT DETERMINATION IN A SUBSTRATE ETCHING PROCESS

RELATED APPLICATIONS

This application is a divisional application of U.S. application Ser. No. 10/286,402 which was filed on Nov. 1, 2002, now U.S. Pat. No. 7,306,696, and which is incorporated by reference herein in its entirety.

BACKGROUND

The present invention relates to the detection of an endpoint in the etching of a substrate.

In the processing of a substrate to fabricate electronic devices, such as integrated circuits and displays, etching processes are carried out to etch materials on the substrate to form patterned features that form components of the electronic devices. For example, the patterned features may comprise gates, vias, contact holes, or interconnect lines. Typically, a patterned mask of etch-resistant features comprising resist or hard-mask materials is formed on the substrate, and exposed areas of the substrate between the etch-resistant features are etched to form the patterned features.

Figure 1:
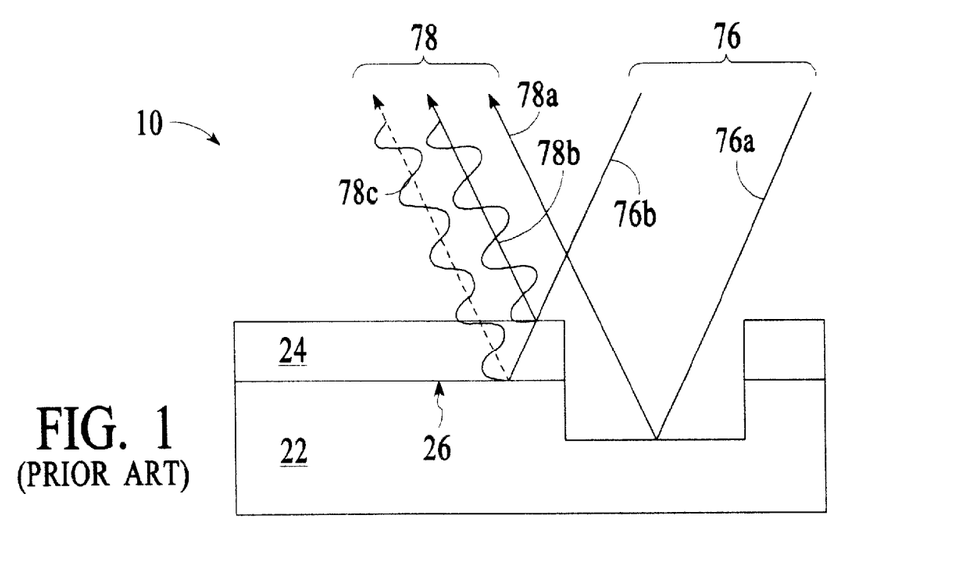
FIG. 1 (Prior Art) is a schematic cross-sectional side view of a substrate from which a light beam is reflected to determine an endpoint of etching of the substrate according to a conventional method.

During the etching process, an endpoint determination method is used to evaluate and control etching progress through the substrate, such as to stop or change etching parameters at a predetermined etch depth. In interferometric endpoint determination methods, as illustrated in FIG. 1 (prior art), light beams 76a,b are directed onto the substrate 10 and the beams are reflected from the substrate 10 to form reflected light beams 78a,b. Constructive and destructive interference of the reflected light beams 78a,b modulate the total or summed reflected light 78 over time to generate interference fringes having intensity maxima and minima. The reflected light 78 is detected by a detector that generates a reflection signal, and the reflection signal is monitored to determine an endpoint of the etching process. The reflection signal exhibits maxima and minima peaks that correspond to interference fringes that arise from primary reflections 78a from the surface of the etch layer 22 and secondary surface reflections 78b from the surface of the mask features 24, as well as from other reflections from internal interfaces between layers of the substrate 10. By counting these interference fringes, it can be determined when an etching process endpoint has been reached, such as a particular etch depth or etch rate, that occurs after a predetermined number of fringes are counted.

However, the effective signal-to-noise ratio of the interference fringes of the reflected light 78 is relatively low because the intensity of the interference signal is also affected by the internal reflections that arise from interfaces within the substrate 10. For example, a portion 76b of the light beam 76 that is incident on the mask features 24 is also partially transmitted to the interface 26 between the mask features 24 and the etch layer 22. The reflection 78c of the light beam 78 from the interface beneath the mask features 24 undesirably interferes with the surface reflections 78a,b to reduce the overall strength or intensity of the reflected light beam 78. This reduction of the reflected light beam intensity hinders endpoint detection by decreasing the effective signal-to-noise ratio of the interference fringes.

As semiconductor devices are fabricated to have increasingly smaller dimensions, it is desirable to detect endpoint with better precision, to stop or change processing when the desired small dimension is reached. However, interface reflections 78c from below the mask features 24 effectively limit the precision and accuracy of endpoint detection by adding noise to the reflection signal. While this noise can be partially removed using filters such as bandpass filters, the filters increase the complexity of the endpoint detection system and often do not reduce the noise to a sufficiently low level. Noise levels are particularly deleterious when etching devices having shallower or more precise depths, or when etching a thin layer on the substrate and stop etching in due time without etching through the thin layer. Accordingly, it is desirable to interferometrically determine the endpoint during substrate processing with higher precision and better signal to noise ratio

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

DESCRIPTION

An endpoint detection system is useful in the fabrication of integrated circuits on substrates, and is particularly useful in the etching of semiconductor, dielectric, or conductor materials of the substrate. Semiconductor and dielectric materials are often layered on one another and make it difficult, for example, to etch through a thick overlying semiconductor material while still stopping the etching process without etching through a thin underlying dielectric material. The dielectric materials may include, for example, nitrides, silicon oxide, silicon dioxide, or low-k dielectrics; and the semiconductor materials may include, for example, polysilicon or silicon. However, the endpoint detection can be used in the etching of other materials such as conductors, or in deposition processes, such as chemical vapor deposition (CVD) and physical vapor deposition (PVD) processes.

Figure 2:
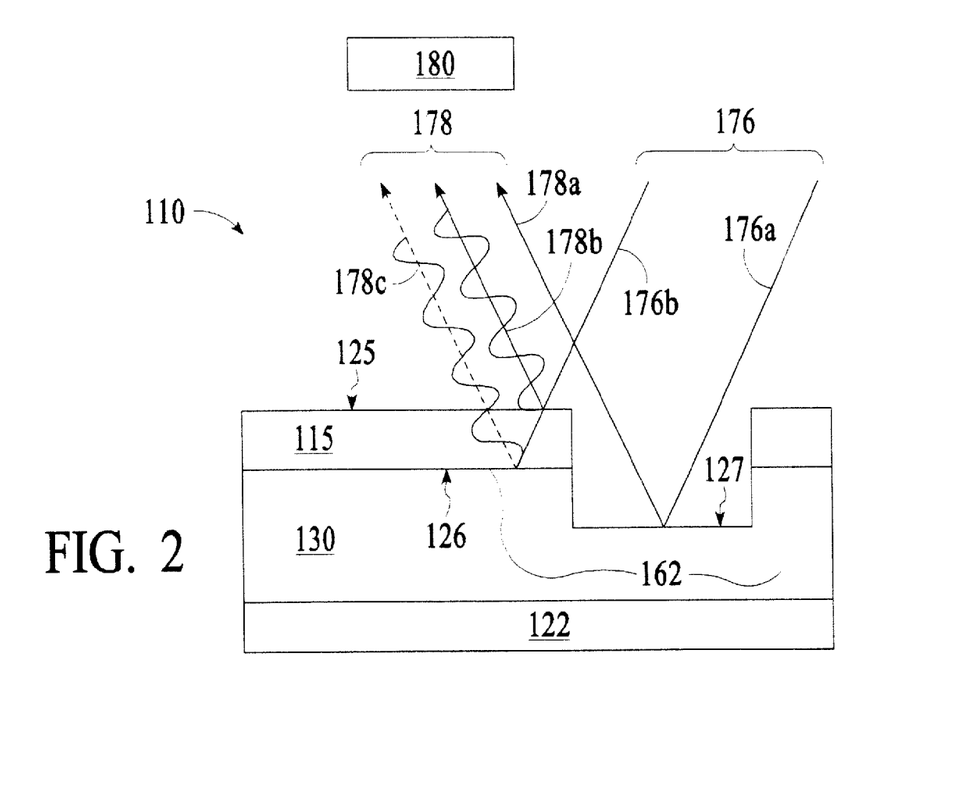
FIG. 2 is a schematic cross-sectional side view of a substrate from which a light beam is reflected to determine an endpoint of etching of the substrate according to an embodiment of the present invention.

FIG. 2 illustrates an exemplary embodiment of a substrate 110 that can be etched using the present process and that is not intended to be limiting. The substrate 110 comprises a mask 115 of patterned features 162 comprising photoresist and/or hard mask, such as silicon oxide or silicon nitride, that are formed by lithographic methods. In one embodiment, the mask 115 comprises a nitride, such as silicon nitride. Alternatively, the mask 115 may comprise photoresist. Between the mask features 162 are exposed areas 127 revealing the underlying materials of the substrate 110 that are open and exposed for etching. At the exposed areas 127, which are below the surface of the mask 115, the substrate 110 comprises an etch material 130 that is to be etched, and an underlying material 122 below the etch material 130. For example, the etch material 130 may be a semiconductor material such as polysilicon. An exemplary underlying material 122 comprises a thin silicon dioxide material, such as having a thickness of from about 10 to about 300 Å.

An example of an endpoint detection method for substrate etching will now be described. In this process, the etch material 130 is etched and the endpoint of the etching process is detected with high accuracy and precision, thus avoiding undesirable etching or damaging of the underlying material 122. As illustrated in FIG. 2, light 176 having a selected wavelength that is directed on the substrate 110 during the etching process. The intensity of the reflected light 178 is measured. The various reflected light beams 178*a-c* of the incident light beams 176*a,b* constructively or destructively interfere with each other to produce a net reflected light 178 with a rapidly modulated intensity as etching progresses, and the modulated intensity is monitored to determine the occurrence of the endpoint.

A light wavelength selector 179 determines a wavelength of the light 176 to locally maximize the intensity of the reflected light 178 at an initial time point of the etching process. This intensity of the reflected light 178 has an approximate maximum at this determined wavelength within a neighborhood of wavelengths. Wavelengths neighboring the determined wavelength produce lower intensities than does the determined wavelength. This wavelength is selected to cause the interference between the secondary surface reflection 178*b* and the interface reflection 178*c* to be substantially constructive at the initial time point at the beginning of an etch process stage, such as before etching or before one etching stage of a multi-stage etching process. For example, a wavelength may be selected such that the additional distance of the path of the interface reflection 178*c* through the mask 115, in comparison to the path of the secondary surface reflection 178*b*, is approximately an integral multiple of the selected wavelength to cause the secondary surface reflection 178*b* and interface reflection 178*c* to be substantially in phase when they emerge from the substrate 110. Constructive interference occurs between the secondary surface reflection 178*b* and the interface reflection 178*c* because these secondary surface and interface reflections 178*b,c* are in phase when they interfere, and thus the intensities of the secondary surface and interface reflections 178*b,c* sum to provide light 178 having a higher intensity. In one version, when a wavelength provides a local maximum of reflected intensity, one or more harmonics of that wavelength (integral multiples of the corresponding frequency) also provide local maxima of the reflected intensity. Factors that can be considered as constraints on the determined wavelength include the absorption spectrum of the mask material. For example, a wavelength may be selected that is not overly absorbed by the mask material even if that wavelength would otherwise provide good constructive interference. The wavelength may also be such that the mask, in its thickness applied on the substrate 110, is permeable to light having the wavelength. Additionally, a wavelength is selected that provides good interferometric fringes when reflected from the substrate 110 being etched because its magnitude is adapted to the lateral and vertical dimensions of the features of the substrate 110. For this embodiment, the selected wavelength is from about 220 to about 300 nm.

Figure 7:
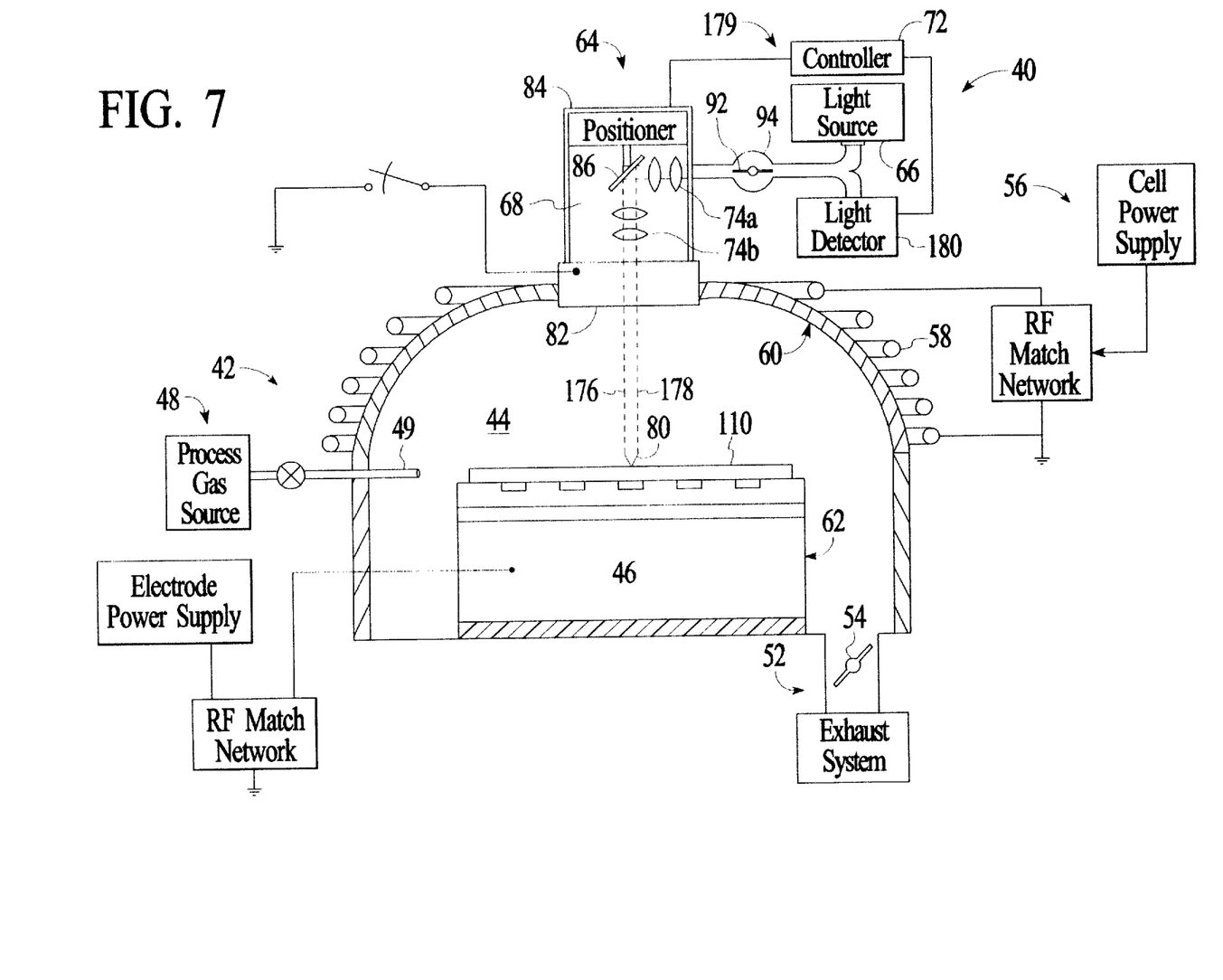
FIG. 7 is a schematic sectional side view of a substrate processing apparatus and endpoint detection system according to the present invention.

The wavelength of the incident light 176 may be scanned through a sequence of successive wavelengths by the light wavelength selector 179, as shown in FIG. 7, to locate a suitable wavelength. The light wavelength selector 179 changes a wavelength of a light reflected from the substrate 110 until a local maximum of an intensity of the light reflected from the substrate is detected. For example, the wavelength may be scanned by reflecting the incident light 176 from a diffraction grating 92 while rotating the diffraction grating 92. The diffraction grating 92 can be rotated by a stepper motor 94 attached to the diffraction grating 92 along an axis that is non-orthogonal to a surface plane of the diffraction grating 92. When the diffraction grating 92 is rotated along this axis, light 176 having a different wavelength is directed towards the substrate 110. Instead of a diffraction grating 92, the wavelength separation device may also be a prism or a selectively transparent medium, such as a wavelength filter.

Figure 4:
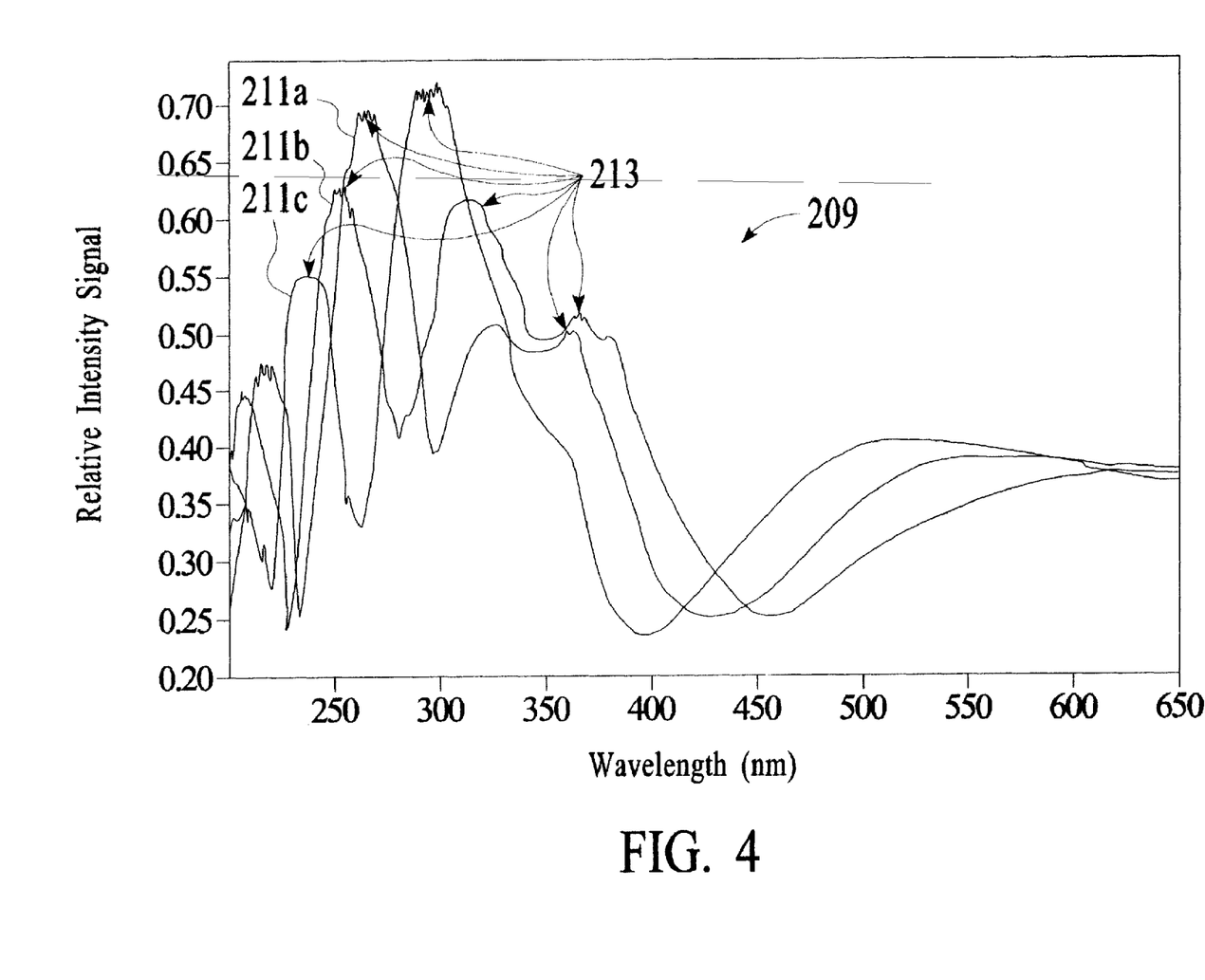
FIG. 4 is a plot of reflected light intensity signals for different wavelengths of light and different mask thicknesses.

Referring to FIG. 4, the wavelength where the intensity of the reflected light 178 is at a local maximum 213, the wave interference between the secondary surface reflection 178*b* from the top surface 125 of the mask 115 and the interface reflection 178*c* from the interface 126 below the mask 115 is constructive rather than destructive. This arises because the secondary surface reflection 178*b* and the interface reflection 178*c*, as is shown in FIG. 2, are in phase at an initial time point in the etching process, to cause constructive interference. In contrast, in the conventional method illustrated in FIG. 1, secondary surface and interface reflections 78*b,c* are out of phase at the initial time point in the etching process, and result in non-constructive or at least partially destructive interference. Selection of the in-phase wavelength prevents the secondary reflection 178*c* coming from the interface 126 below the mask 115 from substantially decreasing the value of the intensity of the reflected light 178. By maintaining a stronger intensity of the reflected light 178, changes in the intensity due to changes in the etch depth are more pronounced and evident, and the precision of the endpoint detection is thus improved.

Figure 3:
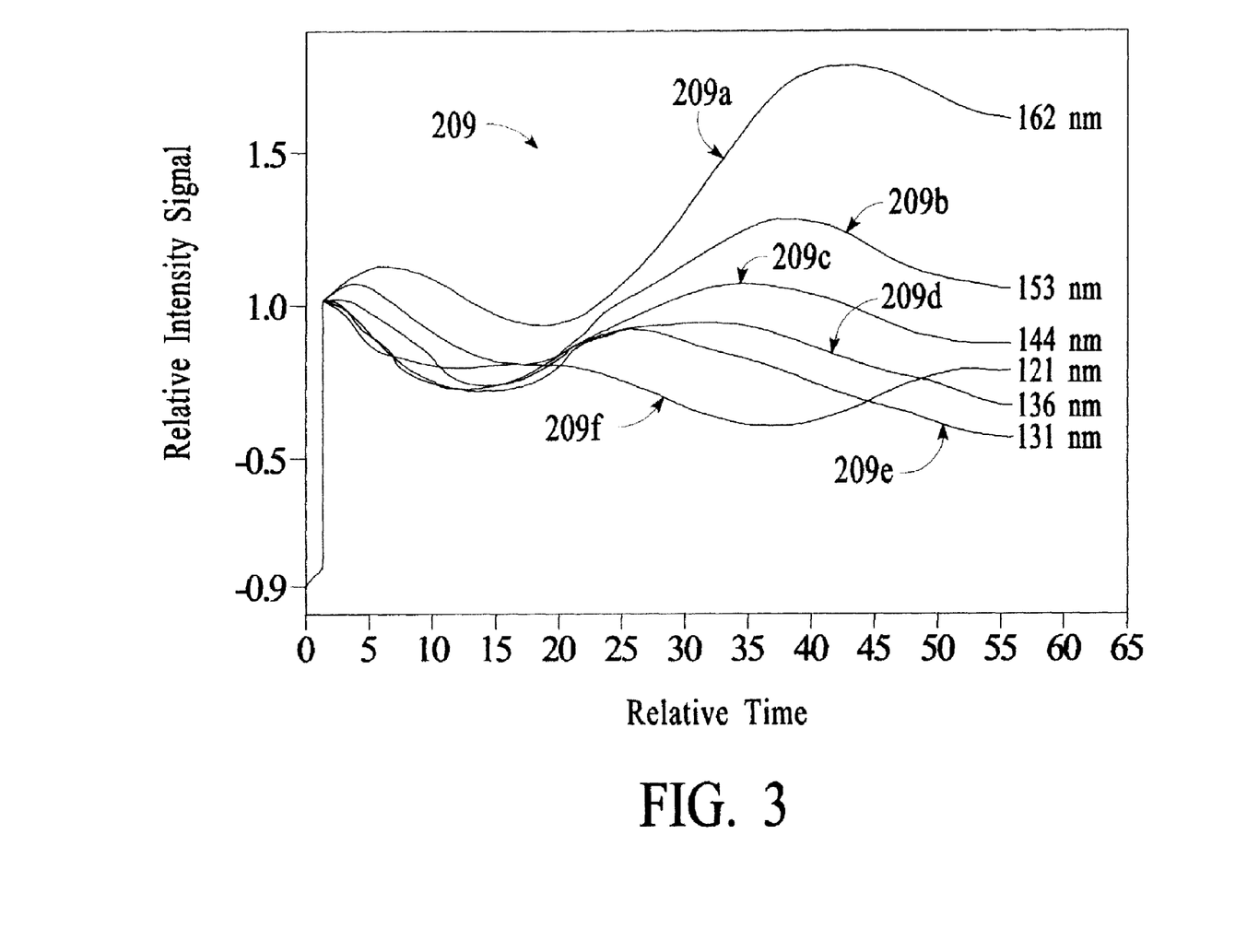
FIG. 3 is a plot of reflected light intensity signals over time and for different mask thicknesses.

An exemplary embodiment of a plot of intensity signals 209 over time as generated by a light detector 180 that receives the reflected light 178, which represent intensities of the reflected light 178, is shown in FIG. 3. In each plot, the mutual interference between the surface reflections 178*a,b* of the reflected light 178 causes the intensity signal 209 to drop and then oscillate. This interference also includes the effect of the interface reflection 178*c* from below the mask 115. However, since the mask 115 is substantially resistant to etching, and thus the mask thickness is substantially constant, the interference fringes of the oscillating signal evidence the phase shift between the secondary surface reflection 178*b* and the interface reflection 178*c*, and indicate the change in etch depth. As a result, the net interference signal arising from etching of the exposed material, i.e., that occurs from the changing path length between the light reflected from the etched surface of the substrate and that reflected from the mask surface and interface, is maximized. This improves the signal to noise ratio of the relevant portion of the endpoint signal.

In this figure, the reflected light intensity signals 209 over time, are for an incident light beam 176 having a wavelength of 235 nm from substrates 110 having silicon nitride masks 115 of different thicknesses. The intensity signals 209 vary significantly depending on the different mask thicknesses. A first curve 209a represents the intensity signal 209 for a mask 115 having a thickness of 162 nm. A second curve 209b corresponds to 153 nm; a third curve 209c corresponds to 144 nm; a fourth curve 209d corresponds to 136 nm; a fifth curve 209e corresponds to 131 nm; and a sixth curve 209f corresponds to 121 nm. As shown by the significant differences and spacings between these curves 209a-f, the thickness of the mask 115 has a substantial effect on the intensity signal 209 of the reflected light 178. For example, in this embodiment the 162 nm wavelength selection results in more pronounced interferometric fringes than the other wavelength selections, and the 121 nm results in less pronounced interferometric fringes than the other wavelength selections. In between these two values is a continuum of the degree to which the surface reflection 178b and interface reflection 178c are destructively interfering, the 162 nm wavelength selection resulting in substantially constructive interference, and the 121 nm wavelength selection resulting in substantially destructive interference.

FIG. 4 is an empirically derived plot showing reflected light intensity signals 209 as a function of the wavelength of the light, from substrates 110 having silicon nitride masks 115 of different thicknesses. A first curve 211a represents the reflected intensity signal for a mask 115 having a thickness of 164 nm. A second curve 211b represents the intensity signal for a mask 115 having a thickness of 153 nm. And a third curve 211c represents the intensity signal for a mask 115 having a thickness of 136 nm. As shown in the Figure, the local maxima 213 have different wavelengths and magnitudes at the different mask thicknesses.

Figure 5:
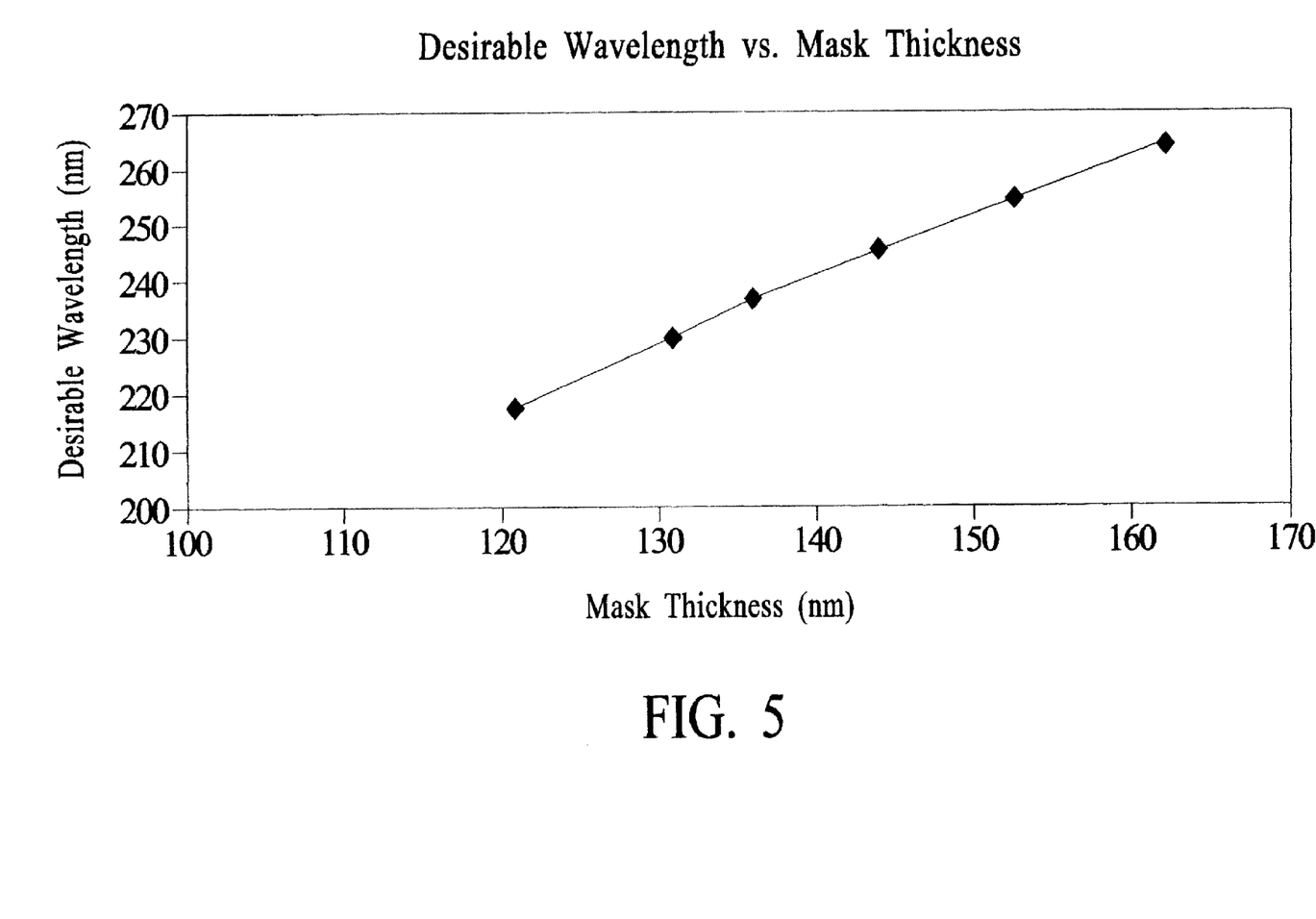
FIG. 5 is a plot of desirable wavelength of light as a function of the thickness of the mask on the substrate from which the light having the wavelength is reflected.

FIG. 5 is an empirical plot showing the change in desirable wavelength (nm) as a function of thickness (nm) of the mask 115. The desirable wavelength increases with increasing mask thickness. In this example, the desirable wavelength changes approximately linearly with the change in mask thickness. This empirically derived relationship between the desirable wavelength and the mask thickness can be used to calculate by interpolation, a desirable wavelength to be selected when the thickness of the mask 115 is known or measured immediately prior to substrate etching, or determined at some initial etching time point.

From the intensity signal traces, the endpoint is typically detected by counting a number of interference fringes in the intensity signal 210 of the reflected light 178, the interference fringes being periodic points in the intensity signal 210, such as local minima or maxima where the derivative of the signal is approximately zero. For example, the endpoint may be detected by counting a sequence of maxima, or alternatively by counting a sequence of minima. Fractional fringes can be counted according to the estimated time until the next fringe based on the shape of the signal waveform. Once a predetermined number of interference fringes are counted, the etching endpoint is determined to have occurred or be near. Alternatively, the endpoint may be detected by comparing the intensity signal 210 of the reflected light 178 to an expected intensity pattern.

The etch depth (d) may be calculated from the interference signal trace using the following equation:

$$d = \frac{f\lambda}{2n}$$

where f is the number of interference fringes counted, $\lambda$ is the wavelength, and n is the relative refractive index of the etch material 130. For example, for a given etch depth (d), an expected number of interference fringes (f) can be calculated. For a desired etch depth, the intensity signal 210 is monitored and the interferences fringes are counted until 'f' fringes have been detected, at which time the etching process is determined to have reached its endpoint.

The wavelength of light at which the local intensity of the signal trace is maximized can be selected by measurement or calculation. For example, the reflection and absorption characteristics of different wavelengths of light reflected from a particular substrate 110 or mask/substrate combination may be determined early in the substrate processing, at an initial time point before a particular etching process stage is started, by a calibration step conducted at the commencement of etching or before the interference fringes are obtained in the reflected signal trace. For example, if the substrate 110 comprises a patterned overlying material and an underlying material, it may be desirable to know the reflection and absorption characteristics of a similar substrate 110 that comprises the underlying material, but substantially absent the patterned overlying material. For example, in one embodiment the overlying material comprises oxide and the underlying material comprises silicon. In one version, a broadband spectrum of light, such as a broadband flash of light, is directed at the substrate 110. Alternatively, a sequence of wavelengths of light may be directed at the substrate 110. Light that is reflected from the substrate 110 is detected to determine a reflectance spectrum representing the absorption and reflection characteristics of a number of different wavelengths in relation to the particular type of the substrate 110. This pre-etch stage calibration step generates a reflectance "snapshot" of reflected intensity signals for a range of ultraviolet wavelengths of light 176 projected on the substrate 110. Exemplary embodiments of reflectance spectra are shown in FIG. 4.

This reflectance snapshot can then be used to normalize the intensity signal 210 of the reflected light 178. For example, the intensity of the signal trace at the wavelength of the light 178 can be normalized by the intensity of the reflectance spectrum at substantially the same wavelength. The normalization removes distortion of the intensity signal 210 that is due to the reflection/absorption characteristics of the substrate 110 and the initial emission characteristics of the light 176 from a light source 66.

In another embodiment, the desirable wavelength of the light 176 is calculated from the reflectance spectrum of the substrate 110 and the thickness of the mask 115. The thickness of the mask 115 may be determined before the counting of the interference fringes by using a separate interferometric method or with a profilometer. A wavelength that results in constructive interference between the secondary surface reflection 178b and the interface reflection 178c from the substrate 110 can be calculated from the incidence angle of the light 176 onto the surface of the substrate 110 and the thickness of the mask 115. The calculated wavelength of light that provides a local maximum of intensity when light having the wavelength is reflected from the substrate. The wavelength is one for which the additional distance from a detection point, of a path of light that passes through the thickness of the mask 115 and is reflected from the interface between the mask 115 and the substrate 110, in comparison to a path of light that is reflected from the surface of the mask 115, is approximately an integral multiple of the wavelength.

The etching and endpoint detection method of the present invention can significantly improve substrate yields by improving the precision of endpoint detection as a function of time, thereby reducing undesirable etching or other damage of the material 122 underlying the etch material 130. For example, the underlying material 122 may be a thin gate oxide layer during etching of a polysilicon etch material 130. By stopping the etching process before the underlying material 122 is damaged by the etching process, the present endpoint detection method provides higher yields and better quality of integrated circuits. By selecting the wavelength of the substrate-incident light 176 to locally maximize the intensity signal 210 at an initial time point of the etching process, destructive interference due to the interface reflection 178c from the interface below the mask 178 is decreased throughout the subsequent etching process, thus improving the precision of the endpoint detection. In one embodiment, a minimum detectable trench depth of less than about 200 nm can be achieved with endpoint detection at the selected wavelengths. For example, the endpoint detection can even detect etch depths of less than about 140 nm, and even less than about 115 nm.

Figure 6:
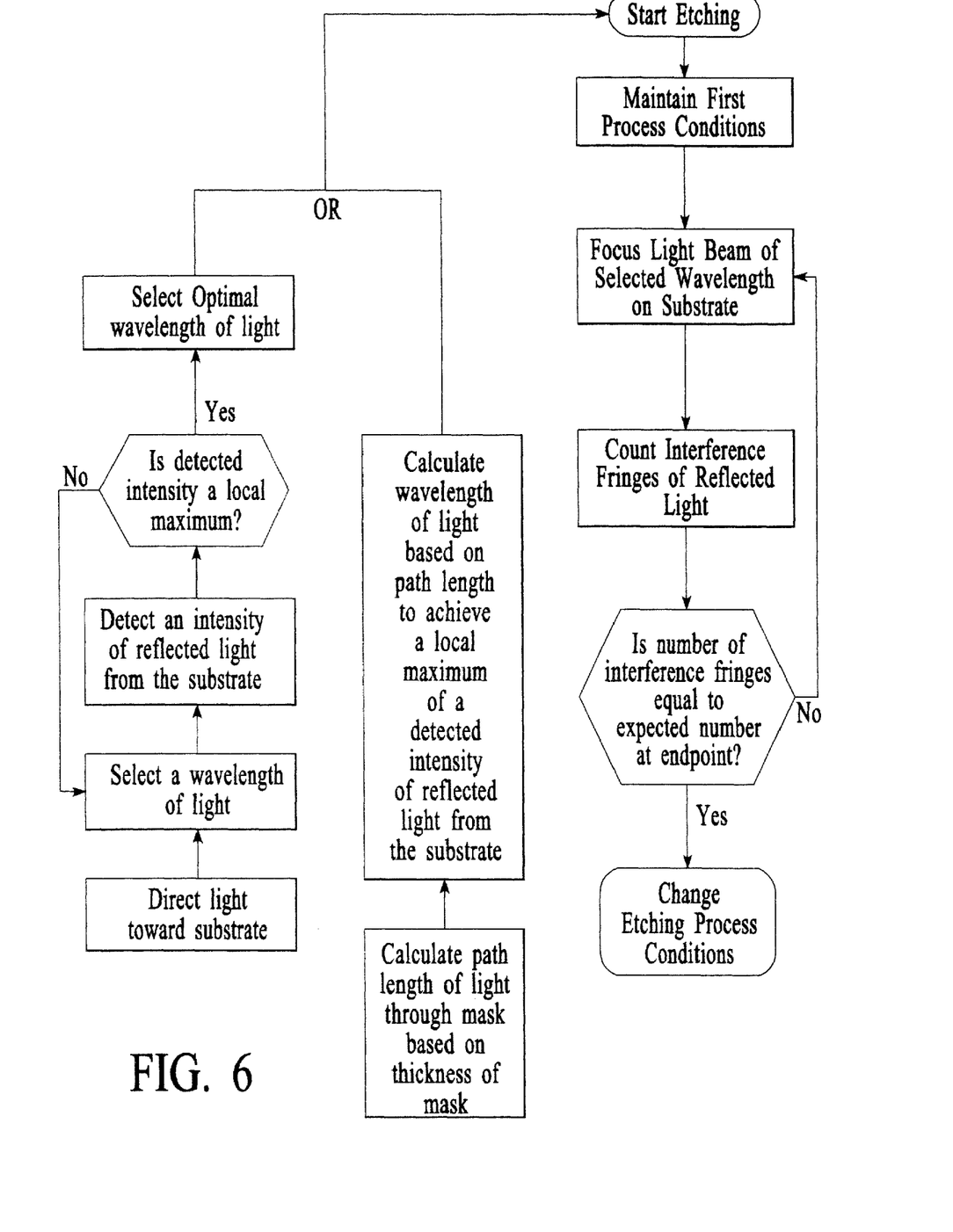
FIG. 6 is a flowchart of process steps used to etch the substrate, detect an etching endpoint, and change the etching process.

In the process of etching and endpoint detection, as represented by the flowchart of FIG. 6, the thickness of the etch material 130 is continuously measured in situ during an actual etching process. When etching is near completion, such as with about 300 Å of the etch material 130 remaining on the substrate 110, the etching process is stopped or first process conditions are changed to second process conditions to provide more controllable etch rates. For example, the second process conditions can provide slower and more controlled etching of the etch material 130, and increase etching selectivity ratio for etching of the etch material 130 relative to underlying material 122. The etch process conditions can be changed by altering gas composition, substrate temperature, or gas energizing levels. For example, an etch rate can be lowered by changing the composition of the etchant gas, such as removing aggressive etchant gases, lowering RF bias power levels, and lowering the substrate temperature.

To controllably change process conditions after a given thickness of the etch material 130 is reached, the endpoint detection method is used to detect the thickness of the etch material 130 and feedback the information to a controller to change process conditions to provide particular etch rates or etching selectivity ratios. The endpoint detection method can be used to detect the moment at which most of the etch material 130 is etched so that the first process conditions can be changed to less aggressive second process conditions, or vice versa, to obtain the desired change in etch rate, etching selectivity ratio, or a change in any other property of the etching process, for example, higher/lower etch rates or etching of the underlying material 122 having a different composition. For example, the endpoint detection method can be used to stop the etching process after a first highly aggressive etching step, which provides high etch rates due to the presence of a fluorinated gas in the etchant gas, to determine the starting point for a second and less reactive etching step, which uses an etchant gas that is substantially absent the fluorinated gas to etch the remaining etch material 130 at a slower etch rate to obtain a more controlled etching process.

The substrate 110 is etched in a substrate processing apparatus 40, such as the embodiment schematically illustrated in FIG. 7, available from Applied Materials Inc., Santa Clara, Calif. The apparatus 40 comprises a process chamber 42 having a process zone 44 for processing the substrate 110, and a support 46 such as an electrostatic chuck that holds the substrate 110 in the process zone 44. The ceiling of the process chamber 42 can be flat or rectangular shaped, arcuate, conical, or dome-shaped. Preferably, the ceiling is multi-radius dome-shaped to generate a good distribution of plasma source power across the volume of the process zone 44 and to provide a more uniform plasma ion density across the substrate surface than a flat ceiling.

The substrate 110 is transferred by a robot arm (not shown) from a load-lock transfer chamber (not shown) through a slit valve (not shown) and into a process zone 44 of the chamber 42. The substrate 110 is held on the support 46 by an electrostatic chuck and helium is supplied through apertures in the chuck to control the temperature of the substrate. Thereafter, the process conditions in the process chamber 42 are set to process the etch material 130 of the substrate 110, the process conditions comprising one or more of process gas composition and flow rates, power levels of gas energizers, gas pressure, and substrate temperature. The process can also be performed in multiple stages, for example, each stage having different process conditions. For example, in an etching process, one or more compositions of process gas comprising etchant gas for etching the substrate 110 are introduced into the chamber 42. Suitable etchant gases for etching materials on the substrate 110 include, for example, chlorine-containing gases and fluorine-containing gases, such as fluorocarbons, and mixtures thereof. The chamber 42 is typically maintained at a pressure ranging from about 0.1 to about 400 mTorr. The etchant gas composition is selected to provide high etch rates and/or high etching selectivity ratios for etching the overlying etch material 130 relative to the underlying material 122. When multiple layers are being sequentially etched, first, second, third, etchant gas compositions can be sequentially introduced into the chamber 42 to etch each particular layer.

Process gases, such as the etchant gases, are introduced into the process zone 44 of the chamber 42 through a gas distribution system 48 that includes a process gas source and a gas flow control system that comprises a gas flow control valve. The gas distribution system 48 can comprise gas outlets 49 located at or around the periphery of the substrate 110 (as shown), or a showerhead mounted on the ceiling of the chamber 42 with outlets therein (not shown). Spent process gas and etchant byproducts are exhausted from the process chamber 42 through an exhaust system (typically including a roughing pump and a turbomolecular pump). A throttle valve 54 is provided in the exhaust system 52 to control the flow of spent process gas and the pressure of process gas in the chamber 42.

A plasma is generated from the process gas using a plasma generator 56 that couples an electric field into the process zone 44 of the chamber 42, or into a remote zone adjacent to the process chamber 42. The plasma in the process zone 44 is maintained at first process conditions suitable for etching the etch material 130 of the substrate 110. A suitable plasma generator 56 comprises an inductor antenna 58 consisting of one or more inductor coils having a circular symmetry with a central axis coincident with the longitudinal vertical axis that extends through the center of the chamber 42 and is perpendicular to a plane of the substrate 110. When the inductor antenna 58 is positioned near the dome ceiling, the ceiling of the chamber 42 comprises dielectric material, such as aluminum oxide, which is transparent to RF fields and is also an electrical insulator material. The frequency of the RF voltage applied to the inductor antenna 58 is typically from about 50 kHz to about 60 MHz, and more typically about 13.56 MHz; and the RF power level applied to the antenna 58 is from about 100 to about 5000 Watts.

In addition to the inductor antenna 58, one or more process electrodes 60, 62 can be used to accelerate or energize the plasma ions in the chamber 42. The process electrodes 60, 62 include a ceiling or sidewalls of the chamber 42 that are electrically grounded or biased to serve as a first electrode 60 that capacitively couples with a second electrode 62 below the substrate 110, to form a capacitive electric field that generates or energizes the plasma in the chamber 42. Preferably, the first and second electrodes 60, 62 are electrically biased relative to one another by the electrode voltage supply that includes an AC voltage supply for providing a plasma generating RF voltage to the second electrode 62 and a DC voltage supply for providing a chucking voltage to the electrode 60. The AC voltage supply provides an RF generating voltage having one or more frequencies of from about 400 kHz to about 13.56 MHz at a power level of from about 50 to about 3000 Watts.

The process chamber 42 further comprises an endpoint detection system 64 that operates according to the above-described endpoint detection method for detecting an endpoint of a process being performed in the chamber 42. Generally, the endpoint detection system 64 comprises a light beam source 66 adapted to emit the incident light 176, a focusing assembly 68 for focusing the incident light 176 onto the substrate 110, and a light detector 180 that measures the intensity of the reflected light 178 from the substrate 110 to generate the intensity signal 210. A controller 72 counts the number of interference fringes in the intensity signal 210. The controller 72 may additionally or alternatively compare portions of the real-time measured intensity signal waveform to a stored characteristic waveform, or other representative pattern, and adjust process conditions in the process chamber 42 when the two waveforms have substantially the same shape.

The light source 66 comprises a monochromatic or polychromatic light source that generates an incident light 176 having an intensity sufficiently high to provide a reflected light 178 that is reflected from the substrate 110 with a measurable intensity. In one version, the light source 66 comprises a monochromatic light source that provides a selected wavelength of light, for example, a He—Ne or ND-YAG laser. In another version, the light source 66 provides polychromatic light, such as a xenon or Hg—Cd lamp. Optionally, the polychromatic light source 66 can be filtered to provide an incident light 176 having the selected wavelengths or color filters can be placed in front of the light detector 180 to filter out all undesirable wavelengths except the desired wavelengths of light, prior to measuring the intensity of the reflected light 178 entering the light detector 180. Typically, the light source 66 may generate a coherent, ultraviolet light. For example, the light source 66 is adapted to generate an emission spectrum of light in wavelengths of from about 200 to about 800 nm.

One or more convex focusing lenses 74a, 74b are used to focus the incident light 176 from the light source 66 as a beam spot 80 onto the substrate 110 and to focus the reflected light 178 back on an active light detecting surface of the light detector 180. The size or area of the beam spot 80 should be sufficiently large to compensate for variations in surface topography of the substrate 110 to enable etching of high aspect ratio features having small openings, such as vias or deep and narrow trenches. The area of the reflected light 178 should be sufficiently large to activate a large portion of the active light detecting surface of the light detector 180. The incident and reflected light 176, 178 is directed through a transparent window 82 in the process chamber 42 that allows the incident and reflected light 176, 178 to pass in and out of the process zone 44.

Optionally, a light beam positioner 84 is used to move the incident light 176 across the substrate surface to locate a suitable portion of the etch material 130, and optionally also a suitable portion of the mask 115, on which to "park" the beam spot 80 to monitor the substrate processing. The light beam positioner 84 comprises one or more primary mirrors 86 that rotate at small angles to deflect the incident light 176 from the light source 66 onto different positions of the substrate 110 (as shown). Additional secondary mirrors can be used (not shown) to intercept the reflected light 178 that is reflected from the substrate 110 and focus the reflected light 178 on the light detector 180. In another embodiment, the light beam positioner 84 is used to scan the light beam 176 in a raster pattern across the substrate surface. In this version, the light beam positioner 84 comprises a scanning assembly consisting of a movable stage (not shown) upon which the light source 66, focusing assembly 68, collecting lens, and detector 70 are mounted. The movable stage can be moved through set intervals by a drive mechanism, such as a stepper motor, to move the beam spot 80 across the substrate 110.

The light detector 180 comprises a light sensitive electronic component, such as a photomultiplier, photovoltaic cell, photodiode, or phototransistor, that provides an electrical intensity signal 210 in response to a measured intensity of the reflected light 178 that is reflected from the substrate 110. The intensity signal 210 can be in the form of a change in the level of a current passing through an electrical component or a change in a voltage applied across an electrical component. The reflected light 178 undergoes constructive and/or destructive interference, which increases or decreases the intensity of the reflected light 178, and the light detector 180 provides an electrical output signal in relation to the measured intensity of the reflected light 178.

Figure 8:
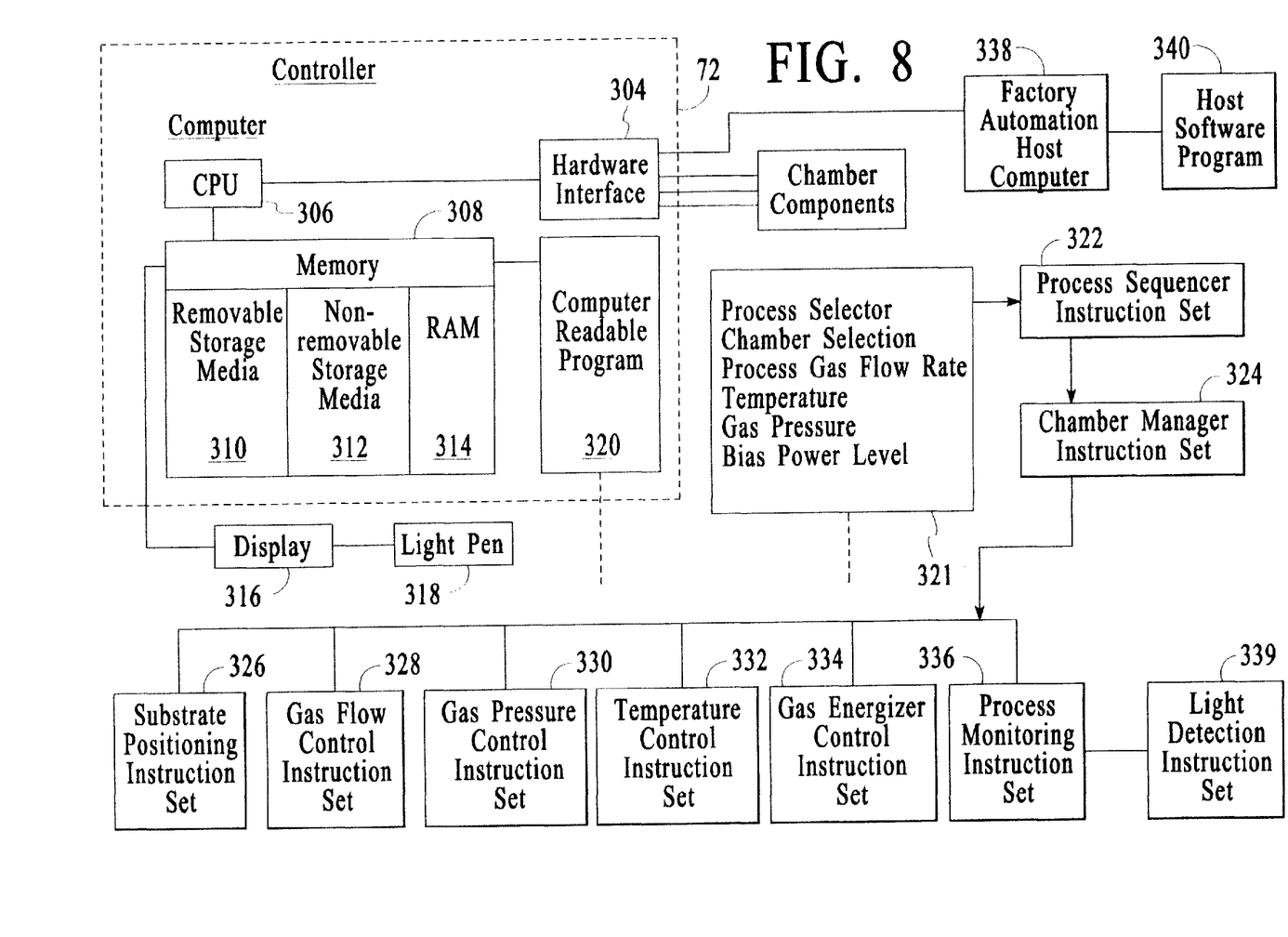
FIG. 8 is a schematic diagram of a controller of the substrate processing apparatus of FIG. 7.

The intensity signal 210 generated by the light detector 180 is passed to the controller 72 for evaluation. An illustrative block diagram of an embodiment of the controller 72 and associated computer-readable program 320 is shown in FIG. 8. The controller 72 may comprise a plurality of interface cards including, for example, analog and digital input and output boards, interface boards, such as a hardware interface board 304, and motor controller boards. The controller 72 further comprises a central processing unit (CPU) 306, such as for example a 68040 microprocessor, commercially available from Synergy Microsystems, California, or a Pentium Processor commercially available from Intel Corporation, Santa Clara, Calif., that is coupled to a memory 308 and peripheral computer components. Preferably, the memory 308 includes a removable storage media 310, such as for example a CD or floppy drive, a non-removable storage media 312, such as for example a hard drive, and random access memory 314. The interface between an operator and the controller 72 can be, for example, via a display 316 and a light pen 318. The light pen 318 detects light emitted by the display 316 with a light sensor in the tip of the light pen 318. To select a particular screen or function, the operator touches a designated area of a screen on the display 316 and pushes the button on the light pen 318. Typically, the area touched changes color, or a new menu is displayed, confirming communication between the user and the controller 72.

In one version, the light wavelength selector 179 comprises software in the computer-readable program 320 of the controller 72 that is adapted to select the wavelength of the incident light 176 in order to maximize the intensity signal 210 of the reflected light 178 at an initial point of the substrate etching process. For example, the computer-readable program 320 may be adapted to drive a stepper motor 94 that is attached to a component of the light source 66 that changes the wavelength of the incident light 176, the stepper motor 94 being capable of rotating the diffraction grating 92 or prism. Additional light wavelength selector software of the computer-readable program 320 may be adapted to monitor the intensity signal 210 of the reflected light 178 and stop the scanning of the wavelength at a local maximum 215 of the intensity signal 210.

In one embodiment, the light wavelength selector 179 comprises code of the computer-readable program 320 that uses the measured thickness of the mask 115 to determine the desirable wavelength. For example, the computer-readable program 320 may be adapted to determine the local maximum 215 at which the signal intensity 210 of the reflected light 178 reaches a peak. In another example, the controller 72 calculates a linear interpolation of the desirable wavelength based on the known mask thickness and a predetermined proportionality between desirable wavelength and mask thickness. Typically, the relationship between the desirable wavelength and the thickness is approximately linear, as shown in FIG. 5. Otherwise, the controller 72 may use a non-linear interpolation to determine the desirable wavelength. Furthermore, both the local maximum method and the linear interpolation method described above may be used together to ensure a more accurate selection of the wavelength.

The computer-readable program 320 of the controller 72 calculates, in real time, the thickness of the etch material 130 remaining of the substrate 110 and accordingly adjusts the process conditions in the process chamber 42. The computer-readable program 320 typically counts the number of interference fringes in the intensity signal 210 of the reflected light 178 and, after a predetermined number of fringes are reached, alters process conditions in the chamber 42 according to programmed guidelines. The computer-readable program 320 can alternatively include program code to compare the shape of the intensity signal 210 to a stored characteristic waveform, or other representative pattern, and determine the endpoint of the etching process when the monitored intensity signal 210 matches the stored characteristic waveform or pattern.

The computer-readable program 320 may be stored in the memory 308, such as on the non-removable storage media 312 or on the removable storage media 310. The computer-readable program 320 generally comprises process control software comprising program code to operate the chamber 42 and its components, process monitoring software to monitor the processes being performed in the chamber 42 safety systems software, and other control software. The computer-readable program 320 may be written in any conventional computer-readable programming language, such as for example, assembly language, $C^{++}$, Pascal, or Fortran. Suitable program code is entered into a single file, or multiple files, using a conventional text editor and stored or embodied in computer-usable medium of the memory 308. If the entered code text is in a high level language, the code is compiled, and the resultant compiler code is then linked with an object code of precompiled library routines. To execute the linked, compiled object code, the user invokes the object code, causing the CPU 306 to read and execute the code to perform the tasks identified in the program.

FIG. 8 also shows an illustrative block diagram of a hierarchical control structure of a specific embodiment of the computer-readable program 320. Using the light pen interface 318, a user may enter instructions into the computer-readable program 320 in response to menus or screens shown on the display 316. The computer-readable program 320 includes program code to control the substrate position, gas flow, gas pressure, temperature, RF power levels, and other parameters of a particular process, as well as code to monitor the chamber process. The process sets are predetermined groups of process parameters necessary to carry out specified processes. The process parameters are process conditions, including without limitations, gas composition, gas flow rates, temperature, pressure and plasma generator settings such as RF or microwave power levels.

The process sequencer instruction set 322 comprises program code to accept a chamber type and set of process parameters from the computer-readable program 320 and to control its operation. The sequencer program 322 initiates execution of the process set by passing the particular process parameters to a chamber manager instruction set 324 that controls multiple processing tasks in the process chamber 42. Typically, the chamber manager instruction set 324 includes a substrate positioning instruction set 326, a gas flow control instruction set 328, a gas pressure control instruction set 330, a gas energizer control instruction set 334, and a process monitoring instruction set 336. Typically, the substrate positioning instruction set 326 comprises program code for controlling chamber components that are used to load the substrate 42 onto the support 46, and optionally to lift the substrate 110 to a desired height in the chamber 42. The gas flow control instruction set 328 comprises program code for controlling the flow rates of different constituents of the process gas. The gas flow control instruction set 328 controls the open/close position of gas flow control valves (not seen) to obtain the desired gas flow rate. The gas pressure control instruction set 330 comprises program code for controlling the pressure in the chamber 42 by regulating the opening size of the throttle valve 54 in the exhaust system 52 of the chamber 42. The gas energizer control instruction set 334 comprises program code for energizing a gas in the chamber 42. For example, the gas energizer control subroutine 334 may comprise code for setting the RF bias voltage power level applied to process electrodes in the chamber 42. Optionally, a temperature control instruction set may be used to control the temperature of the chamber components such as sections of the pedestal 46.

The process monitoring instruction set 334 comprises code for monitoring a process in the chamber 42. In one version, the process monitoring instruction set 334 comprises a light detection instruction set 339 to control the light detector 180. For example, the radiation detection instruction set 339 may comprise code to set detection parameters of the reflected light 178, such as ranges of wavelengths, or may comprise code to process a detected signal from the detection means. Additionally, the radiation instruction set 338 may comprise code which determines the endpoint of a process according to a parameter set input by the operator. For example, the detector 70 delivers a signal related to the intensity of the reflected light 178 to the controller 72. The radiation detection instruction set 339 contained in the controller 72 may process the intensity signal 210 corresponding to the reflected light 178 as a function of time and wavelength. The endpoint of the chamber process may be determined by the radiation detection instruction set 339 once the radiation signal intensity has reached, for example, a pre-determined level for a certain amount of time. A signal is given by the radiation detection instruction set 339 to a factory automated host computer 338 to halt the chamber process or change the process conditions once the process endpoint has been reached.

The data signals received by and/or evaluated by the controller 72 may be sent to the factory automation host computer 338. The factory automation host computer 318 comprises a host software program 340 that evaluates data from several systems, platforms or chambers, and for batches of substrates 110 or over an extended period of time, to identify statistical process control parameters of (i) the processes conducted on the substrates 110 (ii) a property that may vary in a statistical relationship across a single substrate 110 or (iii) a property that may vary in a statistical relationship across a batch of substrates 110. The host software program 340 may also use the data for ongoing in-situ process evaluations or for the control of other process parameters. A suitable host software program comprises a WORKSTREAM™ software program available from aforementioned Applied Materials. The factory automation host computer 338 may be further adapted to provide instruction signals to (i) remove particular substrates 110 from the processing sequence, for example, if a substrate property 110 is inadequate or does not fall within a statistically determined range of values, or if a process parameter deviates from an acceptable range; (ii) end processing in a particular chamber 42, or (iii) adjust process conditions upon a determination of an unsuitable property of the substrate 110 or process parameter. The factory automation host computer 338 may also provide the instruction signal at the beginning or end of processing of the substrate 110 in response to evaluation of the data by the host software program 340.

The present invention is described with reference to certain preferred versions thereof; however, other versions are possible. For example, the endpoint determination method of the present invention can be used to determine endpoint in deposition, cleaning, or other etching processes, as would be apparent to one of ordinary skill. For example, the method can be applied, as would be apparent to one of ordinary skill in the art, to determine endpoint in sputtering etch chambers, cleaning chambers, or deposition chambers. Therefore, the spirit and scope of the appended claims should not be limited to the description of the preferred versions contained herein.

What is claimed is:

1. A method of processing a substrate in a process zone, the method comprising:
    (a) selecting a wavelength of substrate reflected light that provides a local maximum of intensity, by reflecting light from the substrate while scanning through a sequence of successive wavelengths until a local maximum of an intensity of the substrate reflected light is detected;
    (b) processing the substrate by exposing the substrate to an energized gas in the process zone while light having the selected wavelength is reflected from the substrate;
    (c) detecting light reflected from the substrate which has the selected wavelength, and generating a signal; and
    (d) evaluating the signal to determine an endpoint of the process.

2. A method according to claim 1 comprising scanning through wavelengths of from about 200 to about 800 nm.

3. A method according to claim 1 comprising directing a broadband spectrum of light at the substrate, detecting a reflectance spectrum of the light reflected from the substrate, and scanning through the wavelengths of the reflectance spectrum to select a wavelength having a local maximum.

4. A method according to claim 1 wherein the substrate comprises a layer, and the method comprises selecting a wavelength of light such that an internal reflection of the light from an interface between the layer and the substrate, and a surface reflection of the light from the layer, are substantially in phase.

5. A method according to claim 1 wherein the substrate comprises a patterned overlying material and an underlying material, and further comprising:
    (1) in an initial stage, determining a reflectance spectrum of a substrate that is substantially absent the patterned overlying material; and
    (2) in (c), normalizing the intensity of the detected light that is reflected from the substrate by an intensity of the reflectance spectrum at the wavelength of the light reflected from the substrate.

6. A method according to claim 1 wherein the substrate comprises a layer, and further comprising selecting a wavelength of light at which the layer is substantially permeable to light having the wavelength.

7. A method according to claim 1 comprising providing a substrate comprising a mask, and wherein, when a first portion of light having the wavelength is reflected from the surface of the mask and another portion of the light passes through the mask and is reflected from the interface between the mask and the substrate, the wavelength of substrate reflected light that provides a local maximum of intensity is the wavelength at which the interface and surface reflections of light are substantially in phase upon emerging from the substrate.

8. A method according to claim 1 wherein the substrate comprises polysilicon exposed between features of a nitride mask, wherein (b) comprises providing an energized gas capable of etching the polysilicon, and wherein in (a) the selected wavelength of light is from about 200 to about 800 nm.

9. A method of processing a substrate in a process zone, the method comprising:
    (a) determining a wavelength of light that provides a local maximum of intensity when light having the wavelength is reflected from the substrate, by scanning through a sequence of successive wavelengths of light directed onto, or reflected from, the substrate, and detecting a local maximum of an intensity of the light reflected from the substrate;
    (b) processing the substrate by exposing the substrate to an energized gas in the process zone while the substrate is exposed to light having the selected wavelength;
    (c) detecting light reflected from the substrate that has the selected wavelength and generating a signal; and
    (d) evaluating the signal to determine an endpoint of the process.

10. A method according to claim 9 wherein (a) comprises directing a broadband spectrum of light at the substrate and scanning through the spectrum to provide different wavelengths of light.

11. A method according to claim 9 wherein the substrate comprises a patterned overlying material and an underlying material, and further comprising:
    (1) in an initial stage, determining a reflectance spectrum of a substrate that is substantially absent the patterned overlying material; and
    (2) in (c), normalizing the intensity of the detected light that is reflected from the substrate by an intensity of the reflectance spectrum at the wavelength of the light reflected from the substrate.

12. A method according to claim 9 wherein the substrate comprises polysilicon exposed between features of a nitride mask, wherein (b) comprises providing an energized gas capable of etching the polysilicon, and wherein (a) comprises determining a wavelength of light which is from about 200 to about 800 nm.

13. A method of processing a substrate having a layer with a thickness, in a process zone, the method comprising:
    (a) determining a wavelength of light that provides a local maximum of intensity when light having the wavelength is reflected from the substrate, by calculating a wavelength of light based on a pathlength in the thickness of the layer on the substrate that provides a local maximum of intensity when light having the wavelength is reflected from the substrate;

(b) processing the substrate by exposing the substrate to an energized gas in the process zone while the substrate is exposed to light having the selected wavelength; and (c) detecting light reflected from the substrate that has the selected wavelength and generating a signal;

(d) evaluating the signal to determine an endpoint of the process.

14. A method according to claim 13 comprising calculating the wavelength such that the additional distance from a detection point, of a path of light that passes through a thickness of the layer and is reflected from an interface between the layer and the substrate, in comparison to a path of light that is reflected from the surface of the layer, is approximately an integral multiple of the wavelength.

15. A method according to claim 13 comprising calculating the wavelength such that an internal reflection of the light from an interface between the layer and substrate, and a surface reflection of the light from the layer, are determined to be substantially in phase.

16. A method according to claim 13 wherein the substrate comprises a layer comprising a patterned overlying material, and further comprises an underlying material below the patterned overlying material, and further comprising:

(1) in an initial stage, determining a reflectance spectrum of a substrate that is substantially absent the patterned overlying material; and (2) in (c), normalizing the intensity of the detected light that is reflected from the substrate by an intensity of the reflectance spectrum at the wavelength of the light reflected from the substrate.

17. A method according to claim 13 wherein the substrate further comprises exposed features between a layer that is a mask, wherein (b) comprises providing an energized gas capable of etching the exposed features, and wherein in (a) the determined wavelength of the light is from about 200 to about 800 nm.

18. A substrate etching method comprising:

(a) placing a substrate in a process zone, the substrate comprising polysilicon exposed between features of a mask comprising silicon nitride;

(b) providing an energized gas in the process zone that is capable of etching the polysilicon;

(c) detecting an intensity of light that is reflected from the substrate at a wavelength of from about 200 to about 800 nm; and (d) evaluating the detected light intensity to determine an endpoint of etching of the substrate, whereby at an initial time during etching of the substrate, light having the wavelength generates a local maximum in intensity, when a first portion of light having the wavelength is reflected from the surface of the silicon nitride mask and another portion of the light is reflected from the interface between the silicon nitride mask and the polysilicon, and the interface and surface reflections of the light are substantially in phase upon emerging from the substrate.

* * * * *